(12) United States Patent
Stuber et al.

(10) Patent No.: US 7,818,699 B1
(45) Date of Patent: Oct. 19, 2010

(54) DYNAMIC CORE PIPELINE

(75) Inventors: Russell Bryan Stuber, Longmont, CO (US); Stacey Secatch, Longmont, CO (US); Jason R. Lawley, Superior, CO (US)

(73) Assignee: Xilinx, Inc., San Jose, CA (US)

( * ) Notice: Subject to any disclaimer, the term of this patent is extended or adjusted under 35 U.S.C. 154(b) by 800 days.

(21) Appl. No.: 11/706,440

(22) Filed: Feb. 14, 2007

(51) Int. Cl.
*G06F 17/50* (2006.01)
(52) U.S. Cl. .............................. 716/6; 716/12; 716/16; 716/18
(58) Field of Classification Search ................ 716/1–6, 716/16–18; 709/106–109; 712/16, 20, 28, 712/30, 36; 718/102
See application file for complete search history.

(56) References Cited

U.S. PATENT DOCUMENTS

| | | | |
|---|---|---|---|
| 5,499,192 A | 3/1996 | Knapp et al. | |
| 6,191,614 B1 | 2/2001 | Schultz et al. | |
| 6,216,258 B1 | 4/2001 | Mohan et al. | |
| 6,510,546 B1 | 1/2003 | Blodget | |
| 2006/0259878 A1* | 11/2006 | Killian et al. | 716/1 |

* cited by examiner

*Primary Examiner*—Paul Dinh
(74) *Attorney, Agent, or Firm*—William L. Paradice, III; Kevin T. Cuenot

(57) ABSTRACT

A circuit configuration for a pipeline core to be implemented in a programmable integrated circuit (IC) is dynamically specified by providing a single code set embodying an expanded netlist representative of a dynamic circuit configuration of the pipeline core. The code set, which includes one or more parameter variables that determine the length and width of the implemented pipeline core, is synthesized by setting the parameter variables to selected constant values to generate a reduced netlist embodying a static circuit configuration for the implemented pipeline core.

11 Claims, 9 Drawing Sheets

DYNAMIC CORE PIPELINE

FIELD OF THE INVENTION

The present invention relates generally to programmable logic devices and more specifically to providing configuration flexibility using minimal software code.

BACKGROUND

A programmable logic device (PLD) is a general-purpose device that can be programmed by a user to implement a variety of selected functions. One type of PLD is the Field Programmable Gate Array (FPGA), which typically includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated configuration memory cells that control various switches and multiplexers within the CLBs, IOBs, and the interconnect structure to implement logic and routing functions specified by the configuration data. Some FPGAs may include other resources, such as memory, multipliers, processors, clock managers, etc.

As mentioned above, an FPGA device may implement a variety of user designs by appropriately configuring the FPGA's resources using configuration data contained in a configuration bitstream. For example, FIG. 1 shows a system 100 in which an FPGA 122 may be used to perform various functions within a personal computer. FIG. 1 shows system 100 as including a central processing unit (CPU) 110, a controller 120, and a peripheral device 130. CPU 110 is well-known, and is coupled to controller 120 via a personal computer interface (PCI) point-to-point connection 101. Controller 120, which is coupled to peripheral device 130 via signal lines 102, includes an FPGA 122 that may be used to control the operation of peripheral device 130, to facilitate a communication channel between CPU 110 and peripheral device 130, and to ensure that controller 120 correctly receives data transmitted by CPU 110 via the PCI connection 101.

For example, FIG. 2 depicts an exemplary portion 200 of FPGA 122 that is configured to verify the correctness of data received from CPU 110. FPGA portion 200 includes an input circuit 210, a pipeline core 220, a cyclic redundancy check (CRC) function block 230, and an output buffer 240. Input circuit 210, which includes an input to receive data from CPU 110 and an output coupled to pipeline core 220 and to CRC block 230, forwards data to pipeline core 220 and to CRC block 230. CRC block 230, which is well-known, uses a well-known CRC technique to ensure that data transmitted by CPU 110 is correctly received by controller 120, and is configured to generate a valid signal (VALID) indicating whether corresponding data processed therein is valid. The VALID signal is provided to a first input of output buffer 240. For purposes of discussion herein, CRC block 230 requires four cycles of the clock signal CLK to process each data sample, and is configured to receive 32-bits of parallel data from input circuit 210 on each CLK cycle. Pipeline core 220, which is shown to include four delay stages 221(1)-221(4) connected in series between the output of input circuit 210 and a second input of output buffer 240, out-sources the data verification function to CRC block 230. The delay stages 221 are clocked by CLK, and each delay stage includes 32 delay elements connected in parallel (not individually shown in FIG. 2 for simplicity) to provide a 32-bit data path. Each delay stage 221 has a one CLK cycle signal delay so that the signal delay through the four delay elements 221(1)-221(4) is the same as the signal delay through CRC block 230. Output buffer 240 buffers data received from pipeline core 220 and selectively outputs the data to peripheral device 130 in response to VALID.

In addition, FIG. 2 shows the pipeline 220 as including logic A, B, and C, where logic A is coupled between the first and second stages 221(1)-221(2) of the pipeline, logic B is coupled between the second and third stages 221(2)-221(3) of the pipeline, and logic C is coupled between the third and fourth stages 221(3)-221(4) of the pipeline. Logic A-C may perform any suitable logic functions on packet data propagating through the pipeline such as, for example, inserting acknowledgement signals into the packet data, re-aligning the packet data, setting priorities for packet data, and so on. Although not shown for simplicity, logic A-C may be clocked by CLK, or by another suitable synchronous control signal. For some implementations, logic A-C may be omitted.

To process a frame of packet data in FPGA portion 200, the frame is divided into a plurality of 32-bit portions by input circuit 210, and each 32-bit portion is clocked into the pipeline core 220 and to the CRC block 230 on triggering edges of CLK. Input circuit 210 may also generate well-known start-of-frame (SOF) and end-of-frame (EOF) signals (not shown for simplicity) that can be used by CRC block 230 to indicate the beginning and the end, respectively, of the data frame. As mentioned above, the exemplary CRC block 230 of FIG. 2 requires four CLK cycles to verify the correctness of the data. Thus, four CLK cycles after CRC block 230 receives a data portion, CRC block 230 generates the VALID signal, and the corresponding data is concurrently clocked from the fourth delay stage 221(4) of the pipeline core 220 into output buffer 240. Thus, the VALID signal is synchronized with corresponding data propagating through the pipeline core 220 because the signal delay through the four delay elements 221(1)-221(4) is the same as the signal delay of CRC block 230. In addition, operation of logic A-C are synchronized according to their position in the pipeline 220. For example, when a data frame is received into the pipeline, logic A may insert an acknowledgement signal into the packet's start of frame (SOF) field during the first CLK cycle, logic B may re-align the data frame to create room in the data packet for the acknowledgement signal during the second CLK cycle, and logic C may create priority for the data frame during the third CLK cycle.

FIG. 3A is a functional block diagram of a conventional system 300 that a user may utilize to configure the exemplary embodiment of FPGA portion 200 of FIG. 2. First, the user enters a circuit design to be implemented by the FPGA using a user program 310. Program 310 defines a high-level description of the user's circuit design using a hardware descriptor language (HDL) 311 such as Verilog. Typically, the HDL 310 includes a function module (not shown for simplicity) that embodies a CRC block having a four cycle CLK delay and a 32-bit data path, and also includes a pipeline code set (not shown for simplicity) that embodies a pipeline core including four 32-bit delay stages 221 and predefined logic A-C (e.g., as depicted in FIG. 2). Then, a synthesis tool 320 is used to synthesize the high-level description of the circuit design into a netlist 330 that embodies a specific circuit configuration for the pipeline 220 and CRC block 230 (as well as other various components of the FPGA) to be implemented in the FPGA. The netlist 330 is imported into a place and route tool 340 that places and routes the user design to various logic elements on the FPGA and generates a configuration bitstream 350 for the FPGA. Then, the configuration bitstream 350 is provided to the FPGA 360 to configure the FPGA 360 to implement the user design described above with respect to FIG. 2.

If the user desires to configure an FPGA product using another CRC block having a different data width and/or a different signal delay than CRC block 230 of FIG. 2, another pipeline code set is required to implement a pipeline core that has the same signal delay and data width as the other CRC block. For example, if the user desires to configure the FPGA to implement a newer CRC block having a 64-bit data path and a three CLK cycle signal delay, then HDL 311 must be updated to include a new pipeline code set that will implement a pipeline core having three 64-bit delay stages. In addition, if the three 64-bit delay stage pipeline is desired, then the placement, configuration, and operations of the logic (e.g., logic A, B, and/or C) also need to be altered according to the new pipeline length. Thus, each different implementation of a user design typically requires a separate pipeline code set, which may result in an undesirably large number of HDL sets.

One solution to the aforementioned problem is for the HDL 311 to include a plurality of CRC function modules and a corresponding plurality of pipeline core code sets, as depicted in FIG. 3B, which shows HDL 311 as including or having access to a function block library 312 and a pipeline code library 313. For this example, the function block library 312 includes a plurality of CRC modules M1-Mn, each of which embodies a specific circuit design for the CRC block, and the pipeline code library 313 includes a plurality of pipeline code sets P1-Pn, each of which embodies a specific circuit design for the pipeline core. Typically, each of the pipeline code sets P1-Pn corresponds to one of the CRC function modules M1-Mn. For example, if CRC module M1 implements a 32-bit CRC block having a 3 CLK cycle signal delay and CRC module M2 implements a 64-bit CRC block having a 2 CLK cycle signal delay, then pipeline code set P1 may implement a pipeline core having three 32-bit delay stages and associated control for the logic (e.g., A-C), and pipeline code set P2 may implement a pipeline core having two 64-bit delay stages and associated control for the logic. Thus, when designing a circuit to be implemented in the FPGA, a user typically selects the CRC module that embodies a desired circuit configuration for the CRC block, and then must select a corresponding pipeline code set that will implement a pipeline core having the same data width and the same signal delay as the selected CRC block, and that will include appropriate placement and operation of the logic (e.g., A-C).

Although effective in providing design flexibility, maintaining a pipeline code library containing a plurality of different pipeline code sets not only requires considerable storage area but also undesirably increases the complexity of the HDL 311. In addition, if it is desired to alter the structure of the pipeline core or to substitute specific circuit components used to form the pipeline core (e.g., using latches instead of flip-flops to implement the pipeline's delay stages), then each of the pipeline code sets must be updated. Similarly, if a design flaw (e.g., a software glitch or bug) is discovered, then each pipeline code set must be individually updated. As the number of different implementations of an FPGA product increases, the process of updating numerous sections of HDL code corresponding to different pipeline implementations becomes more time consuming and more susceptible to errors.

Therefore, there is a need to reduce the number of parallel code sets maintained in an HDL without reducing design flexibility.

SUMMARY

A method and apparatus are disclosed that allow a user to dynamically specify a circuit configuration for a pipeline core to be implemented in a programmable IC device using a single code set. In accordance with the present invention, a dynamic pipeline code set embodies an expanded netlist representative of a dynamic pipeline core and includes one or more parameter variables that may be used to determine the specific circuit configuration of the resulting pipeline core to be implemented in the programmable IC device. For some embodiments the parameter variables include a signal delay variable and a bus width variable, where the signal delay variable determines how many delay stages are to be included in the implemented pipeline core, and the bus width variable determines how many parallel-connected delay elements are to be included in each of the delay stages. During the design phase, data is provided that includes selected constant values for the parameter variables. For some embodiments, the data may be provided by the user. The parameter variables are set to the selected constant values, and the dynamic code set is synthesized using a well-known synthesis tool to generate a reduced netlist that embodies a static circuit configuration for the pipeline core to be implemented in the programmable IC device.

In this manner, a user may select a variety of pipeline core implementations having various numbers of delay stages and various data widths using a single code set. Because embodiments of the present invention require only one code set to implement a variety of different pipeline cores in the programmable IC device, the size and complexity of the HDL may be reduced, for example, as compared to prior art techniques. Further, software updates to the dynamic pipeline core of the present invention require changes to only one section of the HDL code, which reduces associated errors.

BRIEF DESCRIPTION OF THE DRAWINGS

Like reference numerals refer to corresponding parts throughout the drawing figures.

DETAILED DESCRIPTION

Embodiments of the present invention are described below in the context of a dynamic pipeline core to be implemented in an FPGA for simplicity only. It is to be understood that the present embodiments are equally applicable for dynamically implementing a variety of different circuit configurations for other suitable functional blocks using a single code set, and may be applied to other types of configurable IC devices such as, for example, programmable logic arrays and programmable logic devices, including devices or integrated circuits that are partially programmable. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic states of various signals described herein are exemplary and therefore may be reversed or otherwise modified as generally known in the art. Accordingly, the present invention is not to be construed as limited to specific examples described herein but rather includes within its scope all embodiments defined by the appended claims.

Figure 3A:
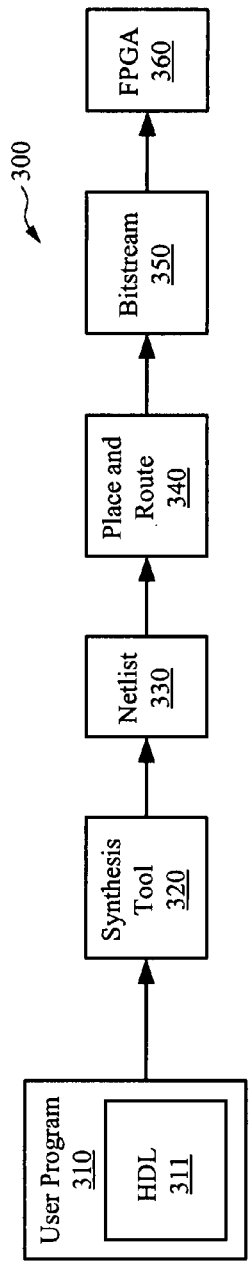
FIG. 3A is a block diagram depicting a conventional configuration operation for the FPGA of FIG. 2.
Figure 3B:
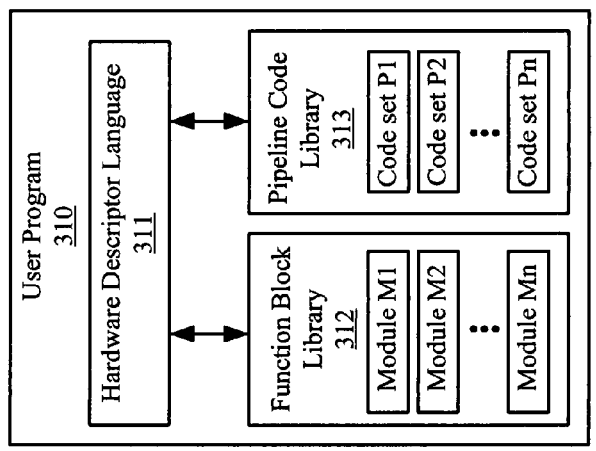
FIG. 3B is a block diagram illustrating a conventional user program including an HDL having access to a function block library and to a pipeline code library.
Figure 4:
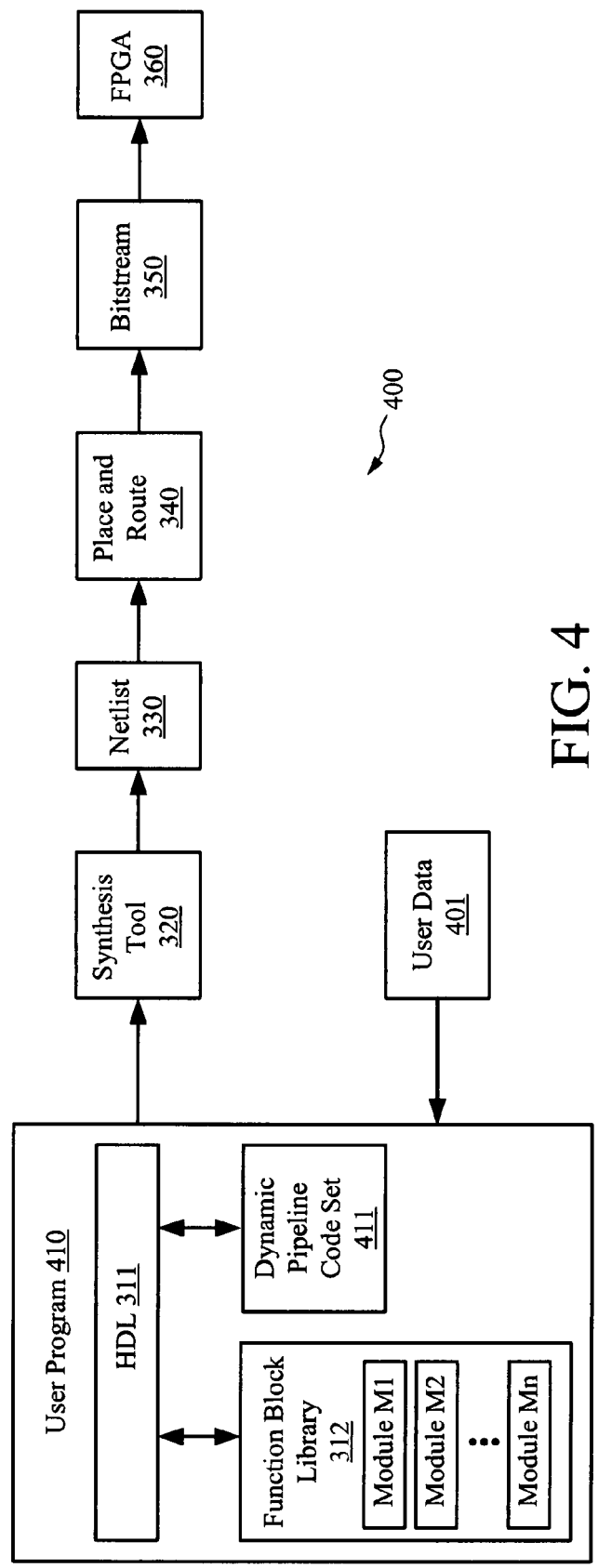
FIG. 4 is a block diagram depicting an exemplary configuration operation for an FPGA in accordance with some embodiments of the present invention.

FIG. 4 is functional block diagram of a configuration system 400 in accordance with some embodiments of the present invention. System 400 includes a user program 410 written using an HDL 311 that includes or has access to function block library 312 and a dynamic pipeline code set 411. The HDL 311 may be any suitable high-level description language such as VHDL or Verilog. For purposes of discussion herein, function block library 312 includes a plurality of CRC modules M1-Mn that embody various circuit configurations for a CRC block to be implemented in an FPGA, for example, as described above with respect to FIG. 3B. Of course, for other embodiments, function block library 312 may include other modules that embody other functional elements (e.g., adders, multipliers, DSPs, and so on) that may be implemented in the FPGA.

In accordance with the present invention, dynamic pipeline code set 411 embodies an expanded netlist representative of a dynamic pipeline core and includes a plurality of parameter variables that may be used to dynamically determine the specific circuit configuration for the pipeline core to be implemented in the FPGA. For some embodiments, the dynamic code set 411 includes a first parameter variable PIPE_DLY that determines how many delay stages are to be included in the implemented pipeline, and includes a second parameter variable BUS_WIDTH that determines how many parallel-connected delay elements are to be included in each of the delay stages of the implemented pipeline. Further, for such embodiments, a parametric length value (PIPE_LENGTH) indicating the total number of delay elements in the pipeline may be generated by multiplying BUS_WIDTH and PIPE_DLY. The dynamic code set 411 is responsive to user data 401 that sets the single code set's parameter variables to selected constant values. Once the parameter variables of the dynamic code set 411 are set to the specified constant values, a design of the pipeline core may be constructed to include a desired number of delay stages (e.g., corresponding to the signal delay) each including a desired number of parallel-connected delay elements (e.g., corresponding to the data width). In this manner, a single pipeline code set may be used to dynamically specify a variety of pipeline cores having various signal delays and various data widths, for example, so that the implemented pipeline core has the same signal delay and data width of the specific CRC block selected to be implemented in the FPGA.

In addition, the number and placement of logic (e.g., A-C) within the pipeline, as well as their associated control signals, may be dynamically defined with respect to the PIPE_DLY parameter in the single pipeline code set.

For some embodiments, the user data 401 may be used to select one of the CRC modules M1-Mn and to set the parameter variables PIPE_DLY and BUS_WIDTH of the dynamic pipeline code set 411 to suitable constants. For other embodiments, a user may determine the signal delay and data width of the CRC circuit that will be implemented in the FPGA, and then include appropriate constant values for PIPE_DLY and BUS_WIDTH in the user data 401.

Figure 5B:
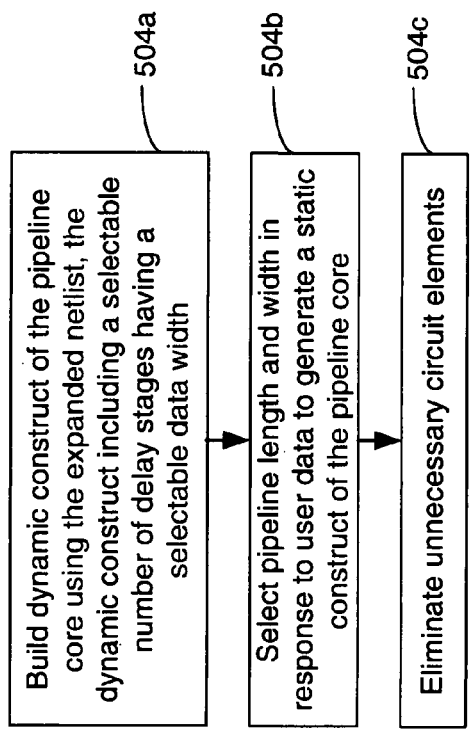
FIGS. 5A-5B are illustrative flow charts depicting an exemplary configuration operation in accordance with the present invention.
Figure 5A:
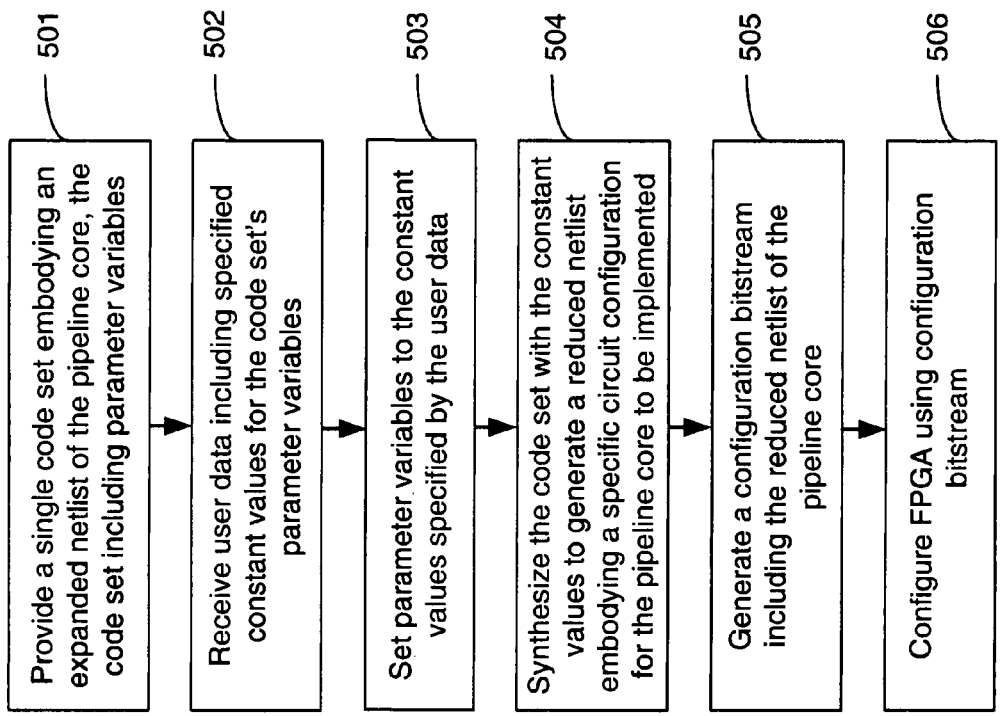
Figure 6A:
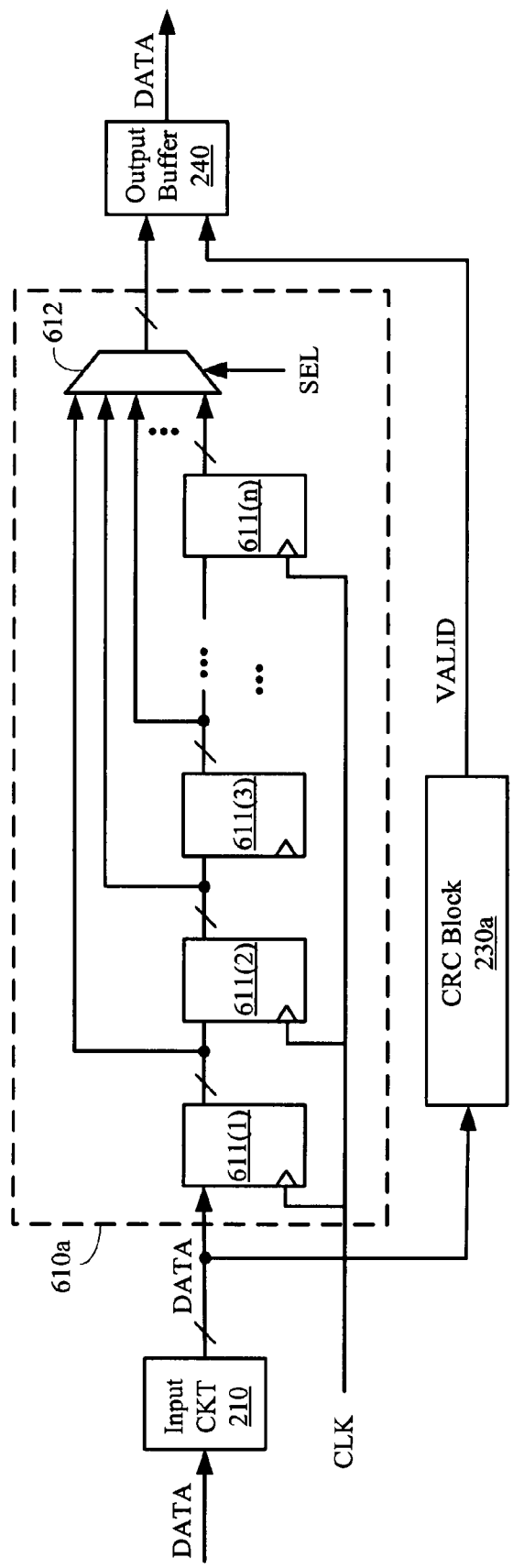
FIG. 6A is a circuit diagram of a dynamic pipeline core embodied by an expanded netlist of a dynamic pipeline code set in accordance with some embodiments of the present invention.

An exemplary configuration operation of system 400 for dynamically specifying a circuit configuration for a pipeline core to be implemented in an FPGA is described with respect to the illustrative flow charts of FIGS. 5A and 5B. First, a single code set embodying an expanded netlist of the pipeline core is provided in the HDL 311 (step 501). For example, FIG. 6A shows an exemplary circuit configuration of a dynamic pipeline core 610a that may be embodied by the expanded netlist of the dynamic code set 411. Pipeline core 610a includes a selectable number of delay stages 611(1)-611(n) and a virtual multiplexer circuit (MUX) 612, and is depicted in FIG. 6A as connected to CRC block 230a. The selectable delay stages 611 are connected in series between the output of input circuit 210 and virtual MUX 612. The delay stages 611 are clocked by a clock signal CLK, and each delay stage includes a selectable number of delay elements (not shown for simplicity) connected in parallel. The selectable delay elements may be any suitable type of delay element including, for example, latches and flip-flops. Further, although described herein as implemented using delay stages 611, for other embodiments, the dynamic pipeline core 610a may be implemented with first-in, first-out (FIFO) memory elements in a well-known manner. Virtual MUX 612 includes a plurality of inputs, an output coupled to the first input of output buffer 240, and a control terminal to receive a select signal SEL. Each input of virtual MUX 612 is connected to the output of a corresponding one of the delay stages 611. In response to SEL, virtual MUX 612 selects data from one of the delay stages 611(1)-611(n) to be provided to output buffer 240. Note that virtual MUX 612 may be used during various design phases, but typically MUX 612 is not actually implemented in the final design, and thus may be thought of as a "virtual" mux. For instance in some embodiments, some or all of MUX 612 may be reduced or eliminated by optimization processes during synthesis.

Figure 1:
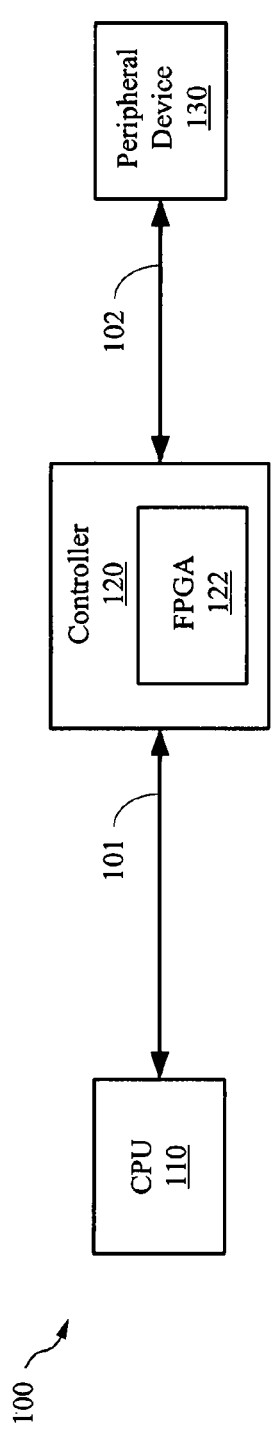
FIG. 1 is simplified block diagram of a system in which an FPGA is employed to control a peripheral device and to implement error checking functions.
Figure 2:
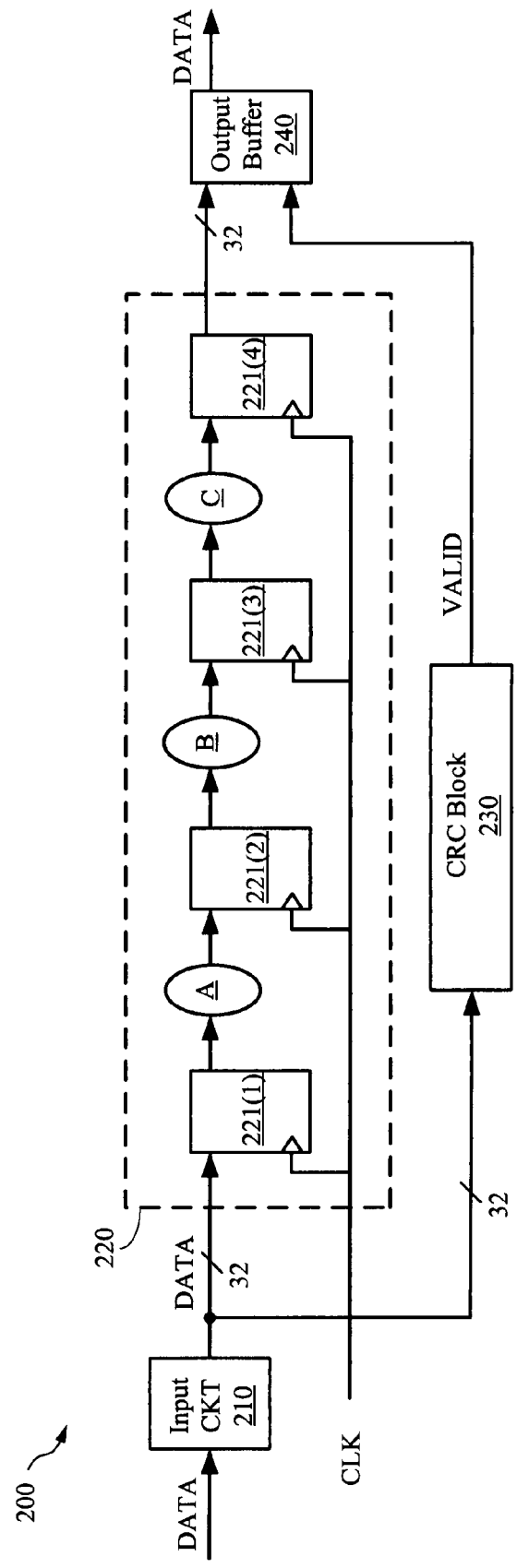
FIG. 2 is a simplified functional block diagram showing the FPGA of FIG. 1 as including a pipeline core that out-sources tasks to a CRC block.

Further, the expanded netlist of the dynamic code set may include optional logic A-C selectively coupled between the various delay stages 611 of the pipeline core 610a, as illustrated in FIG. 6A. For exemplary purposes of discussion herein, logic A is configured to insert an acknowledgement identification signal (insert_ackid) into a packet data's start of frame (SOF) field, for example, to alert an external transmitting device (e.g., CPU 110 of FIG. 1) that the packet data has been received by the FPGA, logic B is configured to generate a re-align command (re-align_data) that re-aligns the packet data frame to create room in the data packet for the acknowledgement signal, and logic C is configured to create a priority for the packet data. For some embodiments, other logic may be inserted within the pipeline. For other embodiments, one or more of logic A-C may be omitted.

Referring again to FIG. 5A, the HDL 311 receives user data 401 that includes specified constant values for the dynamic code set's parameter variables PIPE_DLY and BUS_WIDTH (step 502). For some embodiments, the signal delay (e.g., delay length) and the bus width of the CRC block selected to be implemented in the FPGA are determined, and the specified constant values for PIPE_DLY and BUS_WIDTH are generated in response to the determined signal delay and the bus width of the selected CRC block, respectively. For one embodiment, the user provides the signal delay and the bus width of the selected CRC block. For another embodiment, one of a plurality of CRC blocks is selected (e.g., by the user) from a module library such as library 312, and the HDL provides the signal delay and the bus width of the selected CRC block to the dynamic code set 411.

Next, the dynamic code set's parameter variables PIPE_DLY and BUS_WIDTH are set by the HDL code to the constant values specified by the user data 401 (step 503). The dynamic pipeline code set 411 is then synthesized using a suitable synthesis tool (e.g., such as synthesis tool 320 of FIG. 3A) to generate a reduced netlist that embodies the specific circuit configuration for the pipeline core specified by the user data 401 and to be implemented in the FPGA (step 504).

More specifically, referring also to FIG. 5B, a dynamic construct of the pipeline core may be built by the synthesis tool to include a selectable number of delay stages each including a selectable number of delay elements connected in parallel, for example, as depicted in FIG. 6A (step 504a). Next, the pipeline length and width are selected in response to the user values to generate a static construct of the pipeline core (step 504b). For example, a value for the select signal SEL is generated in response to the specified constant value for PIPE_DLY, and each delay stage 611 is constructed to include the number of parallel-connected delay elements indicated by the specified constant value for BUS_WIDTH. Then, using the synthesis tool, all delay stages 611 subsequent to the selected delay stage 611 are eliminated, the virtual MUX 612 is eliminated, and the output of the selected delay stage 611 is connected to the first input of the output buffer 240 to generate the reduced netlist (step 504c). In addition, the placement and operation control logic may be defined relative to the pipeline length by the construct, for example, as provided by the parameter PIPE_DLY. For an exemplary embodiment, an "insert_ackid" command associated with logic A may be defined with respect to SOF[1], which inserts logic A after the first delay stage of the pipeline, and a "re-align_data" command associated with logic B may be defined with respect to EOF[PIPE_DLY-1], which inserts logic B after the second-to-last delay stage of the pipeline.

Figure 6B:
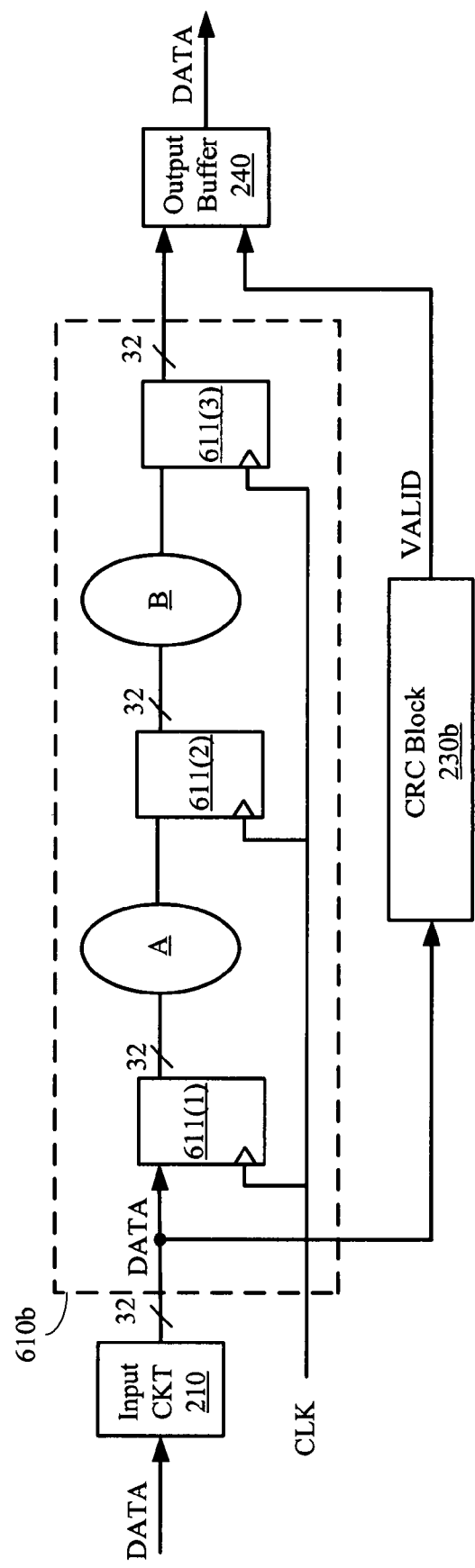
FIGS. 6B-6C show a circuit diagram of a static pipeline core implemented by the dynamic pipeline code set in response to a first set of exemplary constant values for the code set's parameter variables.
Figure 6C:
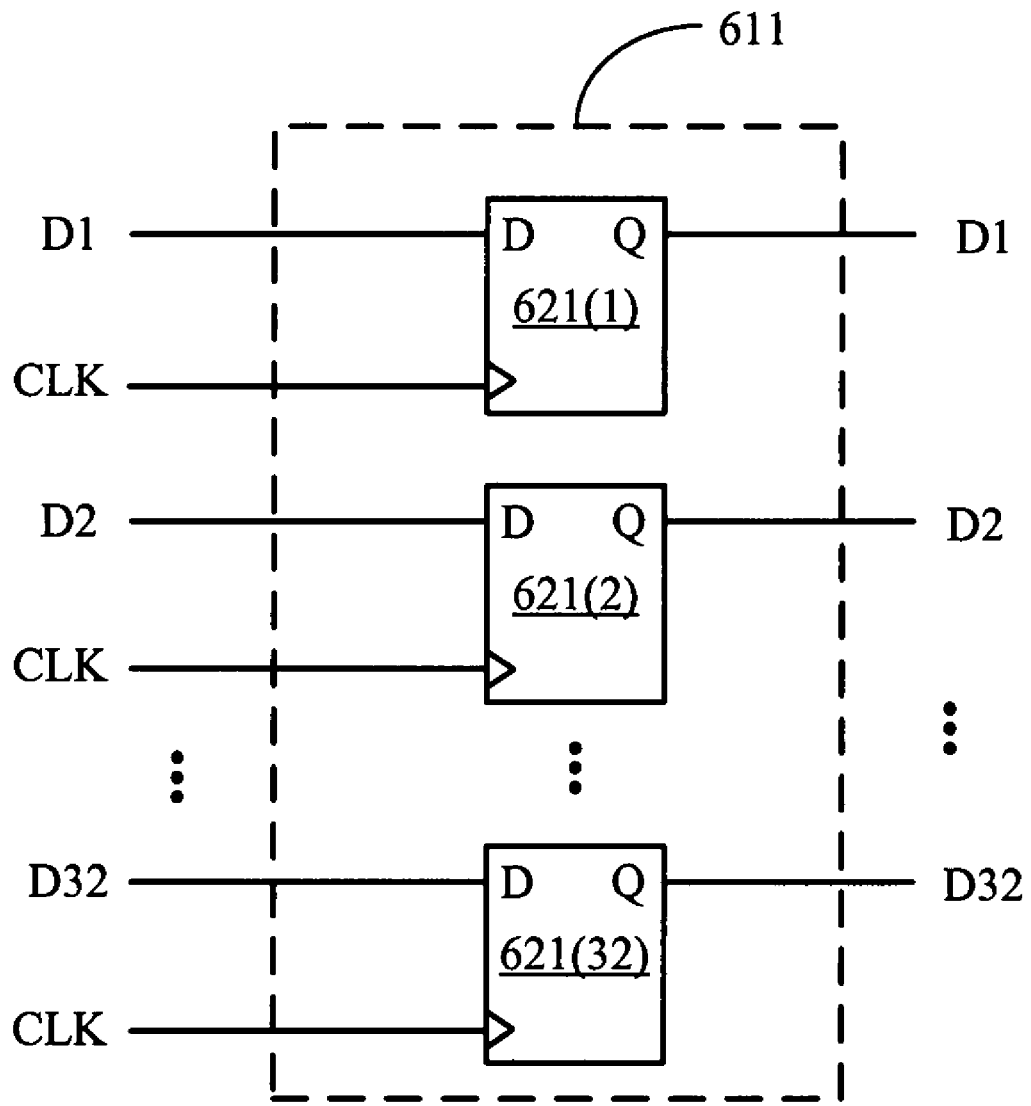

For example, if the CRC circuit selected for implementation in the FPGA has a signal delay of 3 CLK cycles and a bus width of 32 bits, the user data includes constant values that set PIPE_DLY=3 and BUS_WIDTH=32. More specifically, in response to PIPE_DLY=3, the synthesis tool generates a value for SEL that causes virtual MUX 612 to select data output from the third delay stage 611(3) to be provided to the output buffer 240. Also, the synthesis tool provides the "insert_ackid" command at SOF[1], which places logic A after the first delay stage 611(1) in the pipeline, and provides the "re-align_data" command at [PIPE_DLY-1], which places logic B after the second (e.g., 3-1=2) delay stage 611(2). Further, in response to BUS_WIDTH=32, the synthesis tool produces a netlist for each selected delay stage 611(1)-611(3) to include 32 delay elements connected in parallel. Then as noted above, during synthesis, the virtual MUX 612 and all delay stages after the third stage 611(3) are eliminated from the design. The resulting static construct or circuit configuration for this exemplary reduced netlist is depicted in FIG. 6B, where the pipeline core 610b includes three delay stages 611(1)-611(3) connected in series between input circuit 210 and output buffer 240, and each delay stage 611 includes 32 delay elements 621(1)-621(32) connected in parallel, as depicted in FIG. 6C. In this manner, both the CRC block 230b and the pipeline core 610b have 32-bit data paths, and the valid signal VALID output from the CRC block 230b is synchronized with data in the pipeline core 610b after propagating through three delay stages 611(1)-611(3), thereby allowing the pipeline core 610b to out-source the CRC task to the CRC block 230b and to receive corresponding results from the CRC block 230b.

In addition, the static pipeline 610b includes logic A coupled between the first delay stage 611(1) and the second delay stage 611(2), and includes logic B coupled between the second delay stage 611(2) and the third delay stage 611(3). In this manner, logic A and B are automatically positioned in the pipeline according to the pipeline length parameter specified by the user.

Figure 6D:
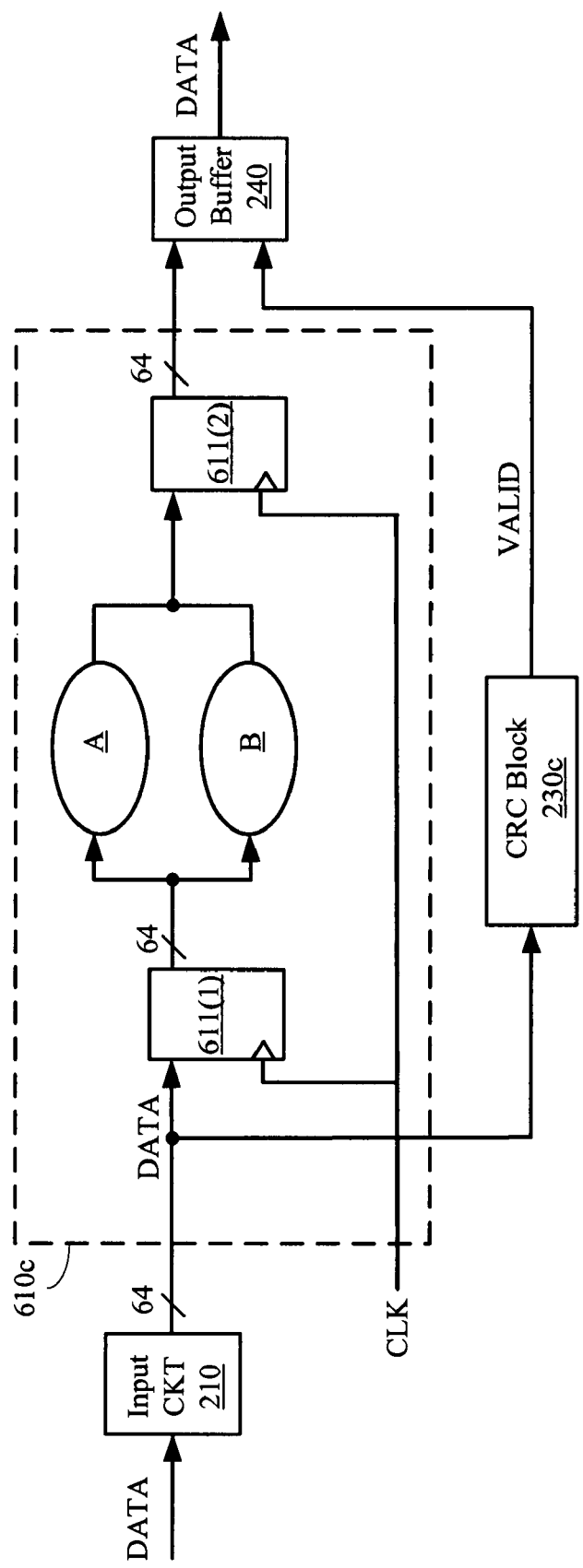
FIGS. 6D-6E show a circuit diagram of a static pipeline core implemented by the dynamic pipeline code set in response to a second set of exemplary constant values for the code set's parameter variables.
Figure 6E:
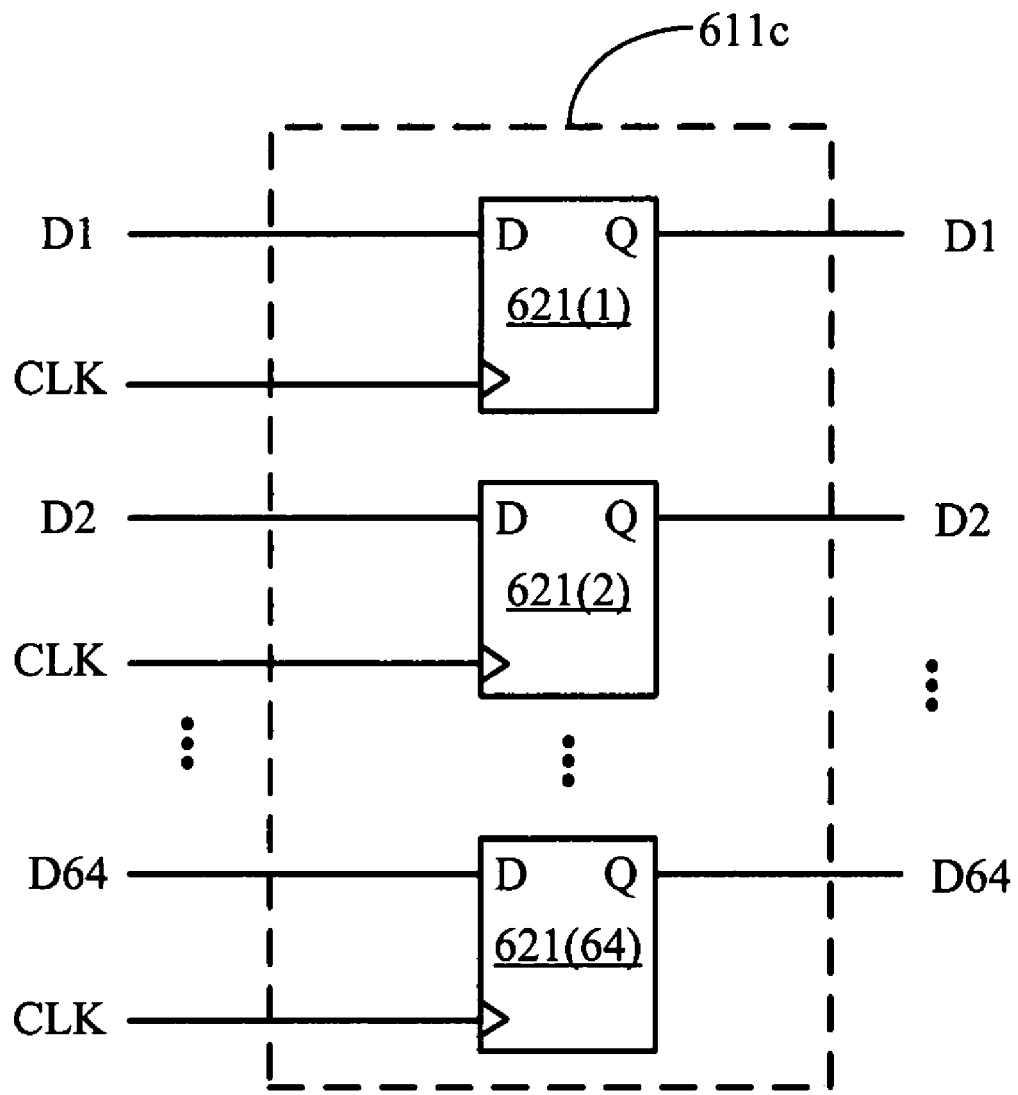

For another example, if the CRC circuit selected for implementation in the FPGA has a signal delay of 2 clock cycles and a bus width of 64 bits, the user data includes constant values that set PIPE_DLY=2 and BUS_WIDTH=64. More specifically, in response to PIPE_DLY=2, the synthesis tool generates a value for SEL that causes virtual MUX 612 to select data output from the second delay stage 611(2) to be provided to the output buffer 240. Also, the synthesis tool provides the "insert_ackid" command at SOF[1], which places logic A after the first delay stage 611(1) in the pipeline, and provides the "re-align_data" command at [PIPE_DLY-1], which places logic B after the first (e.g., 2-1=1) delay stage 611(1). Further, in response to BUS_WIDTH=64, the synthesis tool produces a netlist for each of the selected delay stages 611(1)-611(2) to include 64 delay elements connected in parallel. Then as noted above, during synthesis; the virtual MUX 612 and all delay stages after the second delay stage 611(2) are eliminated from the design. The resulting static construct for this exemplary reduced netlist is depicted in FIG. 6D, where the pipeline core 610c includes two delay stages 611(1)-611(2) connected in series between input circuit 210 and output buffer 240, and each delay stage 611 includes 64 delay elements 621(1)-621(64) connected in parallel, as depicted in FIG. 6E. In this manner, both the CRC block 230c and the pipeline core 610c have 64-bit data paths, and the valid signal VALID output from the CRC block 230c is synchronized with data in the pipeline core 610c after propagating through two delay stages 611(1)-611(2), thereby allowing the pipeline core 610c to out-source the CRC task to the CRC block 230c and to receive corresponding results from the CRC block 230c.

In addition, the static pipeline 610c includes logic A and B connected in parallel between the first delay stage 611(1) and the second delay stage 611(2). In this manner, logic A and B are automatically positioned in the pipeline according to the pipeline length parameter specified by the user.

Thereafter, the reduced netlist is provided to a well-known place and route tool that generates a configuration bitstream that embodies the selected CRC block and the specified circuit configuration for the pipeline core (step 505). Then, the FPGA is configured with the configuration bitstream in a well-known manner (step 506).

As described above, embodiments of the present invention allow a user to select a variety of pipeline core implementations having various numbers of delay stages and various data widths using a single code set. By using a single code set to implement a variety of different pipeline cores in the programmable IC device, the size and complexity of the HDL may be reduced, for example, as compared to prior art techniques. Further, because any number of various pipeline implementations may be specified using a single code set, modifications (e.g., additions, deletions, and/or changes) to the dynamic pipeline structure may be accomplished by updating the same code set, thereby reducing re-programming time and reducing updating errors.

Although the present invention has been described in connection with several embodiments, it is understood that the present invention is not limited to the embodiments disclosed, but is capable of various modifications, which would be apparent to a person skilled in the art. Thus, the present invention is limited only by the following claims.

What is claimed is:

1. A method of dynamically specifying a circuit configuration for a pipeline core to be implemented in a programmable integrated circuit (IC) and adapted to out-source tasks to a function block selected to be implemented in the programmable IC, the method comprising:

providing a single code set comprising an expanded netlist representative of a dynamic circuit configuration of the pipeline core that includes a selectable and variable number of delay stages each comprising a selectable number of parallel-connected delay elements, the code set including a delay length parameter variable and a bus width parameter variable;

determining a signal delay and a bus width of the selected function block using a computer;

generating a delay length constant and a bus width constant in response to the determining;

setting the delay length parameter variable to the delay length constant;

setting the bus width parameter variable to the bus width constant; and synthesizing the code set with the parameter variables set to the constants to generate a reduced netlist comprising a static circuit configuration for the implemented pipeline core that has the same signal delay and the same bus width as the selected function block, wherein the static circuit configuration comprises a fixed number of delay stages.

2. The method of claim 1, wherein the code set comprises a hardware descriptor language.

3. The method of claim 1, wherein the function block comprises a cyclic redundancy check (CRC) circuit.

4. The method of claim 1, wherein synthesizing the code set comprises:

selecting a specific number of the delay stages to be included in the implemented pipeline core in response to the delay length constant; and selecting a specific number of the delay elements to be included in each of the selected delay stages in response to the bus width constant.

5. The method of claim 1, wherein synthesizing the code set comprises:

building a dynamic construct of the pipeline core using the expanded netlist, the dynamic construct including a virtual multiplexer having a plurality of inputs each coupled to an output of a corresponding one of the selectable number of delay stages;

generating a multiplexer select signal in response to the delay length constant, wherein the multiplexer select signal selects one of the delay stages to provide an output signal for the pipeline core; and eliminating from the construct the virtual multiplexer and all delay stages subsequent to the selected delay stage.

6. A system for dynamically specifying a circuit configuration for a pipeline core to be implemented in a programmable integrated circuit (IC) and adapted to out-source tasks to a function block selected to be implemented in the programmable IC, the system comprising:

a memory that includes a single code set comprising an expanded netlist representative of a dynamic circuit configuration of the pipeline core that includes a selectable and variable number of delay stages each comprising a selectable number of parallel-connected delay elements, the code set including a delay length parameter variable and a bus width parameter variable;

means for determining a signal delay and a bus width of the selected function block;

means for generating a delay length constant and a bus width constant in response to the determining;

means for setting the delay length parameter variable to the delay length constant and for setting the bus width parameter variable to the bus width constant; and means for synthesizing the code set with the parameter variables set to the constants to generate a reduced netlist comprising a static circuit configuration for the implemented pipeline core that has the same signal delay and the same bus width as the selected function block, wherein the static circuit configuration comprises a fixed number of delay stages.

7. The system of claim 6, wherein the code set comprises a hardware descriptor language.

8. The system of claim 6, wherein the function block comprises a cyclic redundancy check (CRC) circuit.

9. The system of claim 6, wherein the means for synthesizing the code set comprises:

means for selecting a specific number of the delay stages to be included in the implemented pipeline core in response to the delay length constant; and means for selecting a specific number of the delay elements to be included in each of the selected delay stages in response to the bus width constant.

10. The system of claim 6, wherein the means for synthesizing the code set comprises:

means for building a dynamic construct of the pipeline core using the expanded netlist, the dynamic construct including a virtual multiplexer having a plurality of inputs each coupled to an output of a corresponding one of the selectable number of delay stages;

means for generating a multiplexer select signal in response to the delay length constant, wherein the multiplexer select signal selects one of the delay stages to provide an output signal for the pipeline core; and means for eliminating from the construct the virtual multiplexer and all delay stages subsequent to the selected delay stage.

11. The system of claim 6, wherein the code set further embodies a control circuit for outsourcing the task from the pipeline core to the selected function block and for returning result information from the selected function block to the pipeline core.

* * * * *